(12) United States Patent
Matsuura

(10) Patent No.: US 6,849,950 B1
(45) Date of Patent: Feb. 1, 2005

(54) SEMICONDUCTOR DEVICE AND METHOD OF MANUFACTURING SAME

(75) Inventor: Yoshihiro Matsuura, Tokyo (JP)

(73) Assignee: NEC Electronics Corporation, Tokyo (JP)

(*) Notice: Subject to any disclaimer, the term of this patent is extended or adjusted under 35 U.S.C. 154(b) by 471 days.

(21) Appl. No.: 09/604,527

(22) Filed: Jun. 27, 2000

(30) Foreign Application Priority Data

Jun. 29, 1999 (JP) .......................................... 11-184474

(51) Int. Cl.$^7$ ........................ H01L 23/12; H01L 23/48; H01L 21/30; H01L 21/46

(52) U.S. Cl. ...................................... 257/777; 438/455

(58) Field of Search ................................ 257/777–778, 257/747, 783, 787, 686; 438/455–459, 460, 108, 118, 127, 125, 106, 110, 113, 124, 617

(56) References Cited

U.S. PATENT DOCUMENTS

| | | | | |
|---|---|---|---|---|
| 5,208,188 A | * | 5/1993 | Newman | 437/220 |
| 5,882,956 A | * | 3/1999 | Umehara et al. | 438/111 |
| 6,114,753 A | | 9/2000 | Nagai et al. | |
| 6,268,236 B1 | * | 7/2001 | Miyawaki | 438/106 |

FOREIGN PATENT DOCUMENTS

| | | | |
|---|---|---|---|
| JP | S63-010550 | * | 1/1988 |
| JP | 1-69934 A | | 7/1989 |
| JP | 06-302629 A | | 10/1994 |
| JP | H11-219962 | * | 8/1999 |
| TW | 345724 | | 5/1997 |

OTHER PUBLICATIONS

Hoopman et al., "New Film Type Die Attach Adhesives", IEEE, 1988.*

* cited by examiner

Primary Examiner—Craig A. Thompson
(74) Attorney, Agent, or Firm—Sughrue Mion, PLLC

(57) ABSTRACT

Before a semiconductor chip (2) is mounted on package board (5), an insulating layer (3) is formed on the reverse side of the semiconductor chip (2) for preventing insulation failures. If the insulating layer (3) is formed by applying an insulating film, then the insulating layer (3) reliably achieves a predetermined thickness for reliable electric insulation and can easily be formed. The semiconductor chip (2) with the insulating layer (3) formed thereon is fixed to the package board (5) which has surface interconnections (7) by an insulating adhesive (adhesive layer 4). The semiconductor chip (2) and the surface interconnections (7) are insulated from each other by the insulating layer (3). Therefore, the adhesive may be used in a minimum quantity. Since the semiconductor chip (2) can be pressed under an increased pressure, the semiconductor chip (2) is reliably joined to the package board (5). Surface irregularities existing on the surface of the package board (5) due to the surface interconnections (7) are filled up with and covered by the adhesive, leaving no gaps on the surface of the package board (5).

15 Claims, 8 Drawing Sheets

SEMICONDUCTOR DEVICE AND METHOD OF MANUFACTURING SAME

BACKGROUND OF THE INVENTION

1. Field of the Invention

The present invention relates to a semiconductor device and a method of manufacturing such a semiconductor device, and more particularly to a semiconductor device with a semiconductor chip mounted thereon and a method of manufacturing such a semiconductor device.

2. Description of the Related Art

Generally, semiconductor chips are mounted on package boards of semiconductor devices in view of the environment in which they are used and the ease with which they are installed on the package boards. There are available various types of packages designed to meet the different sizes of semiconductor chip and the numbers of terminals thereof. If semiconductor chips have many terminals, then it is often customary to use packages of the BGA (Ball Grid Array) type with terminals arranged in a grid pattern on the lower surface of the package or packages of the LGA (Land Grid Array) type.

FIG. 1 of the accompanying drawings fragmentarily shows in cross section an internal structure of a conventional semiconductor device, and FIG. 2 of the accompanying drawings fragmentarily shows in cross section an internal structure of another conventional semiconductor device.

As shown in FIG. 1, the conventional semiconductor device, generally denoted at 101, has a semiconductor chip 102 mounted on surface interconnections 107 of a package board 105. With this structure, it is necessary to insulate the semiconductor chip 102 from the surface interconnections 107. It is the general practice to coat a solder resist layer 103 on the surface of the package board 105, and secure the semiconductor chip 102 to the solder resist layer 103 with an insulating adhesive layer 104 (first conventional structure).

According to a recent attempt, no solder resist is used, but, as shown in FIG. 2, a semiconductor chip 102 is insulated from surface interconnections 107 by only an insulating adhesive layer 104a by which the semiconductor chip 102 is secured in position (second conventional structure).

However, the above conventional structures have suffered the following problems:

(1) Problems of the First Conventional Structure (FIG. 1)

In recent years, an insulating resin tape is frequently used as an insulating base 106 of the package board 105 in order to reduce the size and thickness of the semiconductor device 101. However, when the solder resist layer 103 is formed, the package board 105 with the insulating resin tape used as the insulating base 106 tends to be distorted and warped due to the warpage of the tape itself and the heat hysteresis that is experienced when the semiconductor device is assembled. Particularly, if the insulating resin tape is of an elongate rectangular shape having a large area, then its feedability is greatly reduced due to the warpage, making it difficult to assemble the semiconductor device. Attempts to guard against the warpage and other difficulties have been responsible for an increase in the cost of the semiconductor device.

For example, if the package board 105 is in the form of an elongate strip, then a feel-to-reel feed system needs to be employed to supply the package board 105 to the manufacturing process. The feel-to-reel feed system has a supply reel, on which the package board 105 prior to being processed is wound, preceding a processing position for unreeling the package board 105, and a takeup reel following the processing position for winding the processed tape from the processing position.

If the package board 105 as processed into an elongate rectangular shape is to be supplied to the manufacturing process, then a dedicated fixing jig for processing the package board 105 into an elongate rectangular shape is required. While small severed pieces of package board may be supplied to the manufacturing process, it is cumbersome to handle those package board pieces and the efficiency with which to manufacture semiconductor devices is lowered.

(2) Problems of the Second Conventional Structure (FIG. 2)

The second conventional structure is problematic in that defects tend to occur in the manufacturing process because the semiconductor chip 102 and the package board 105a are insulated from each other by only the insulating adhesive layer 104a. For example, since it is difficult to control strictly the amount of an insulating adhesive to be supplied to form the insulating adhesive layer 104a, the supplied amount of the insulating adhesive is often liable to vary from time to time. Even when the insulating adhesive is supplied in a constant quantity, the coated thickness of the insulating adhesive layer 104a tends to differ from place to place due to slight pressure differences that occur when the semiconductor chip 102 is bonded by the insulating adhesive layer 104a. Another problem is that the applied adhesive may be forced out of place. Furthermore, if the insulating adhesive is coated by a nozzle, then air bubbles are likely to be trapped in the insulating adhesive layer 104a.

SUMMARY OF THE INVENTION

It is therefore an object of the present invention to provide a highly reliable semiconductor device in which a semiconductor chip and surface interconnections formed on a package board are reliably insulated from each other, and a method of manufacturing such a semiconductor device.

In order to solve above problem, according to a first aspect of the present invention, there is provided a semiconductor device comprising a board with interconnections disposed on at least a face side thereof, a semiconductor chip with rill, circuit components disposed on at least a face side thereof, an insulating film disposed on a reverse side of the semiconductor chip, and an adhesive layer disposed between a face side of the insulating film and the face side of the board and joining the insulating film and the board to each other, each of the insulating film and the adhesive layer being made of at least one material selected from the group consisting of an epoxy resin, a polyimide resin, and an acrylic resin.

According to a second aspect of the present invention, there is provided a semiconductor device comprising a board with interconnections disposed on at least a face side thereof, a semiconductor chip with circuit components disposed on at least a face side thereof, the semiconductor chip being arranged to have a reverse side thereof facing the board over a region of the board where the interconnections are disposed, and an insulating film disposed between the board and the semiconductor chip and joining the board and the semiconductor chip to each other, the film being made of at least one material selected from the group consisting of an epoxy resin, a polyolefin resin, and a polyimide resin.

According to a third aspect of the present invention, there is provided a method of manufacturing a semiconductor device, comprising the steps of forming an insulating film on a reverse side of a semiconductor chip, and bonding the semiconductor chip to a board with an adhesive, each of the insulating film and the adhesive being made of at least one material selected from the group consisting of an epoxy resin, a polyimide resin, and an acrylic resin.

Preferably, in the third aspect, the step of forming an insulating film comprises the steps of forming the insulating film on a reverse side of a semiconductor wafer which has circuit elements making up a plurality of semiconductor chips on a face side thereof, thereafter, dicing the semiconductor wafer and the insulating film into individual semiconductor chips.

Preferably, in the third aspect, the step of forming the insulating film comprises the step of forming the insulating film according to a spin coating process.

Preferably, the method according to the third aspect further comprises the step of, after the insulating film is formed and before the semiconductor wafer and the insulating film are diced, forming a support layer for supporting the individual semiconductor chips on the insulating film.

Preferably, in the third aspect, the step of forming an insulating film comprises the steps of applying a film of a laminated structure including an insulating layer which serves as the insulating film and a base layer, to a reverse side of a semiconductor wafer with the insulating layer facing the reverse side of the semiconductor wafer, dicing the semiconductor wafer and the insulating layer into individual semiconductor chips, and thereafter, peeling the base layer off the insulating layer which is joined to a reverse side of each of the semiconductor chips.

According to a fourth aspect of the present invention, there is provided a method of manufacturing a semiconductor device, comprising the steps of applying an adhesive insulating film to a reverse side of a semiconductor chip, and joining the semiconductor chip to a board with the adhesive insulating film, the insulating film being made of at least one material selected from the group consisting of an epoxy resin, a polyimide resin, and an acrylic resin.

Preferably, in the fourth aspect, the step of applying an adhesive insulating film comprises the steps of applying a film of a laminated structure including an insulating layer which serves as the insulating film and a base layer, to a reverse side of a semiconductor wafer with the insulating layer facing the reverse side of the semiconductor wafer, dicing the semiconductor wafer and the insulating layer into individual semiconductor chips, and thereafter, peeling the base layer off the insulating layer which is joined to a reverse side of each of the semiconductor chips.

The semiconductor device according to the first aspect of the present invention and the manufacturing method according to the third aspect of the present invention will be described in greater detail below.

The insulating film is formed on the reverse side of the semiconductor chip. Specifically, the insulating film is formed on the reverse side of the semiconductor wafer, and thereafter the semiconductor wafer and the insulating film are diced into individual semiconductor chips.

The insulating film may be formed by applying the insulating film. For example, the film of the laminated structure including the insulating layer and the base layer is applied to the reverse side of the semiconductor wafer. If the film itself has stickiness or adhesion, then the film can be applied to the reverse side of the semiconductor wafer based on the stickiness or adhesion. Then, the semiconductor wafer and the insulating layer are diced into individual semiconductor chips. Since the diced semiconductor chips are held in position by the base layer, the semiconductor chips are protected against falling and damage. Thereafter, the base layer is peeled off the insulating layer which is joined to a reverse side of each of the semiconductor chips.

Alternatively, the insulating film may be formed by coating a resin on the reverse side of the semiconductor wafer according to the spin coating process. In this alternative process, it is preferable to form a support layer on the insulating film for supporting the diced semiconductor chips.

The insulating film or the insulating layer is preferably made of at least one material selected from the group consisting of an epoxy resin, a polyolefin resin, and a polyimide resin.

After the insulating film is formed, the semiconductor chip is joined to the board by an adhesive. The adhesive or adhesive layer is preferably made of at least one material selected from the group consisting of an epoxy resin, a polyimide resin, and an acrylic resin.

In the semiconductor device thus manufactured, the semiconductor chip with the insulating film on the reverse side thereof and the board with the interconnections on its face side are joined to each other by the adhesive or adhesive layer. With this structure, the semiconductor chip and the interconnections are reliably insulated from each other by the insulating film.

The semiconductor device according to the second aspect of the present invention and the manufacturing method according to the fourth aspect of the present invention will be described in greater detail below.

The insulating film is formed on the reverse side of the semiconductor chip. For example, the film of the laminated structure including the insulating layer and the base layer is applied to the reverse side of the semiconductor wafer. Then, the semiconductor wafer and the insulating layer are diced into individual semiconductor chips. Since the diced semiconductor chips are held in position by the base layer, the semiconductor chips are protected against falling and damage. Thereafter, the base layer is peeled off the insulating layer which is joined to a reverse side of each of the semiconductor chips.

The insulating film or insulating layer is preferably made of at least one material selected from the group consisting of an epoxy resin, a polyolefin resin, and a polyimide resin.

After the base layer is peeled off the insulating layer, the semiconductor chip is joined to the board by the insulating film. The semiconductor chip can be joined to the board due to the stickiness or adhesion of the insulating film itself.

In the semiconductor device thus manufactured, the semiconductor chip and the board with the interconnections on its face side are reliably insulated from each other by the insulating film. Since the semiconductor chip and the board are joined to each other by the insulating film, without applying an adhesive, the semiconductor device can be produced with ease at a low cost.

The above and other objects, features, and advantages of the present invention will become apparent from the following description based on the accompanying drawings which illustrate examples of preferred embodiments of the present invention.

DETAILED DESCRIPTION OF THE PREFERRED EMBODIMENTS

Figure 1:
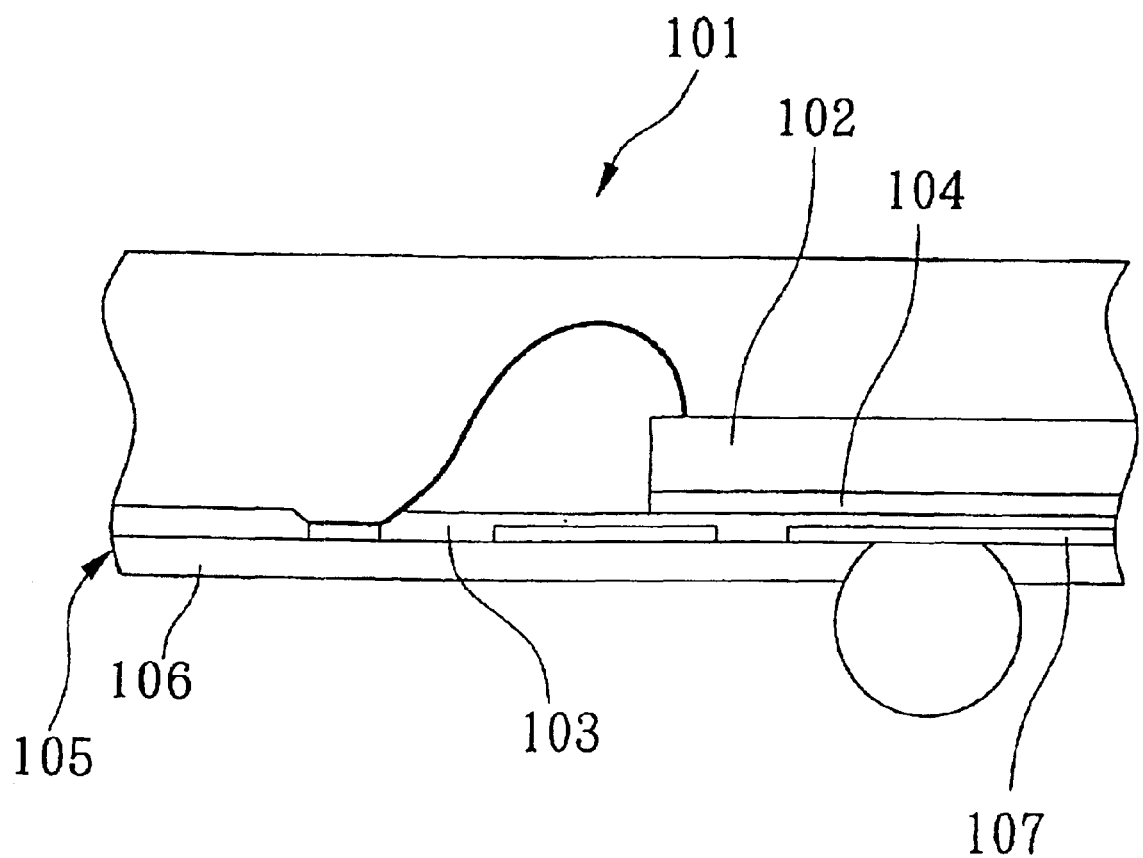
FIG. 1 is a fragmentary cross-sectional view of an internal structure of a conventional semiconductor device.
Figure 2:
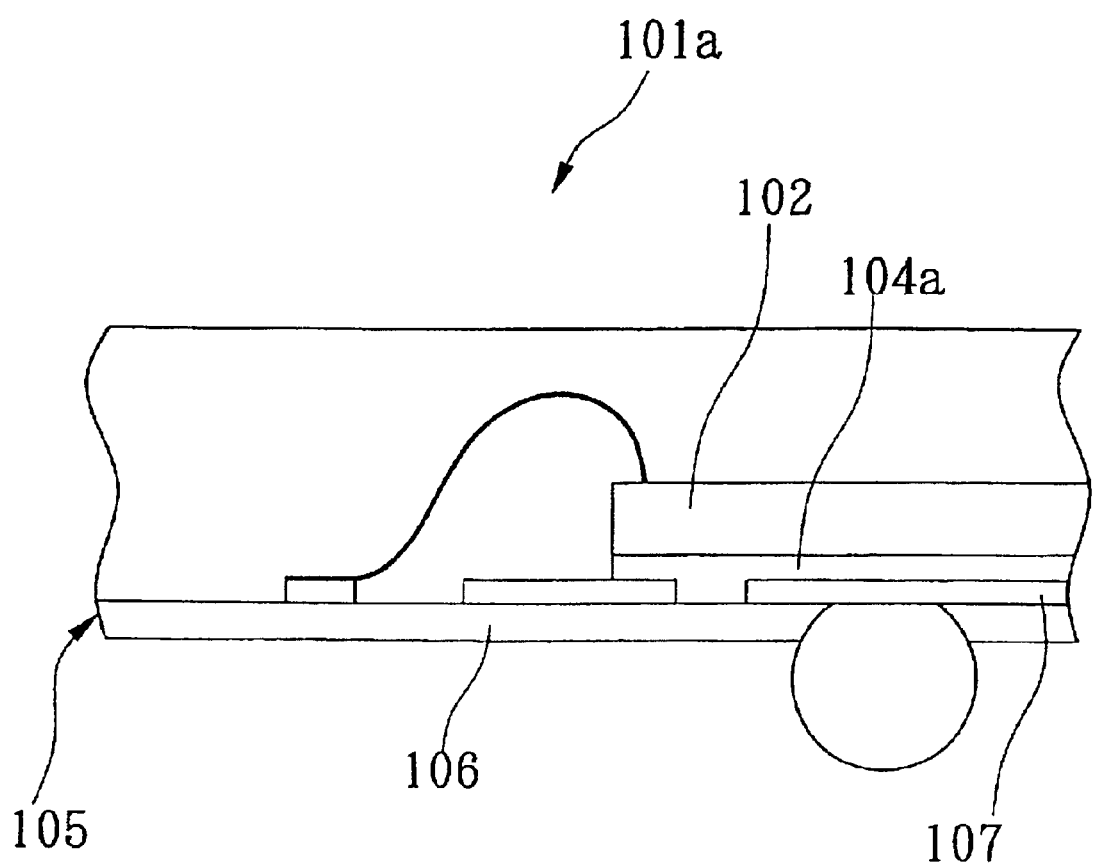
FIG. 2 is a fragmentary cross-sectional view of an internal structure of another conventional semiconductor device.
Figure 3A:
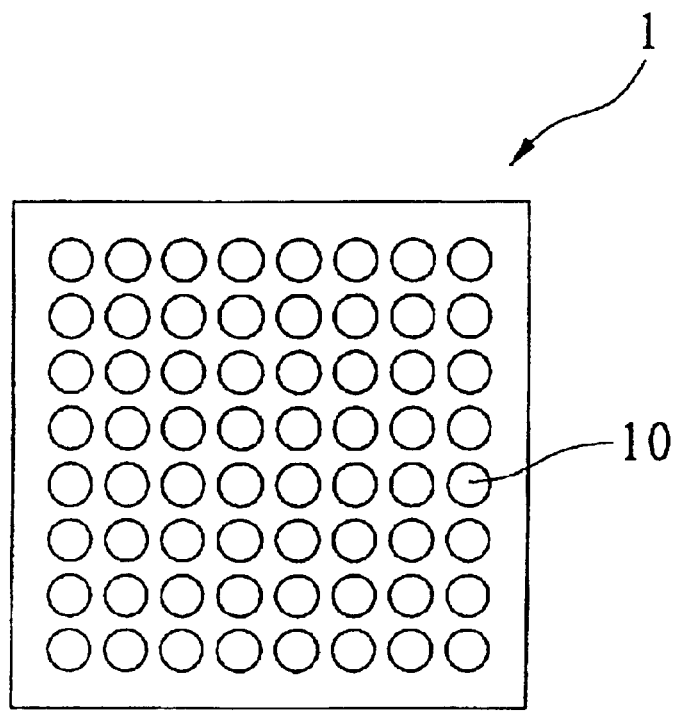
FIG. 3A is a plan view of a semiconductor device according to an embodiment of the present invention.
Figure 3B:
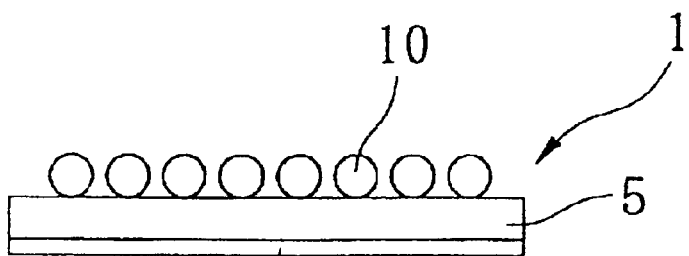
FIG. 3B is a front elevational view of the semiconductor device shown in FIG. 3A.
Figure 3C:
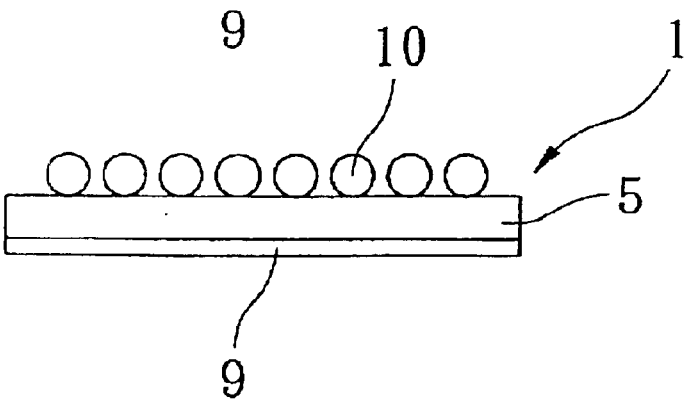
FIG. 3C is a side elevational view of the semiconductor device shown in FIG. 3A.
Figure 4:
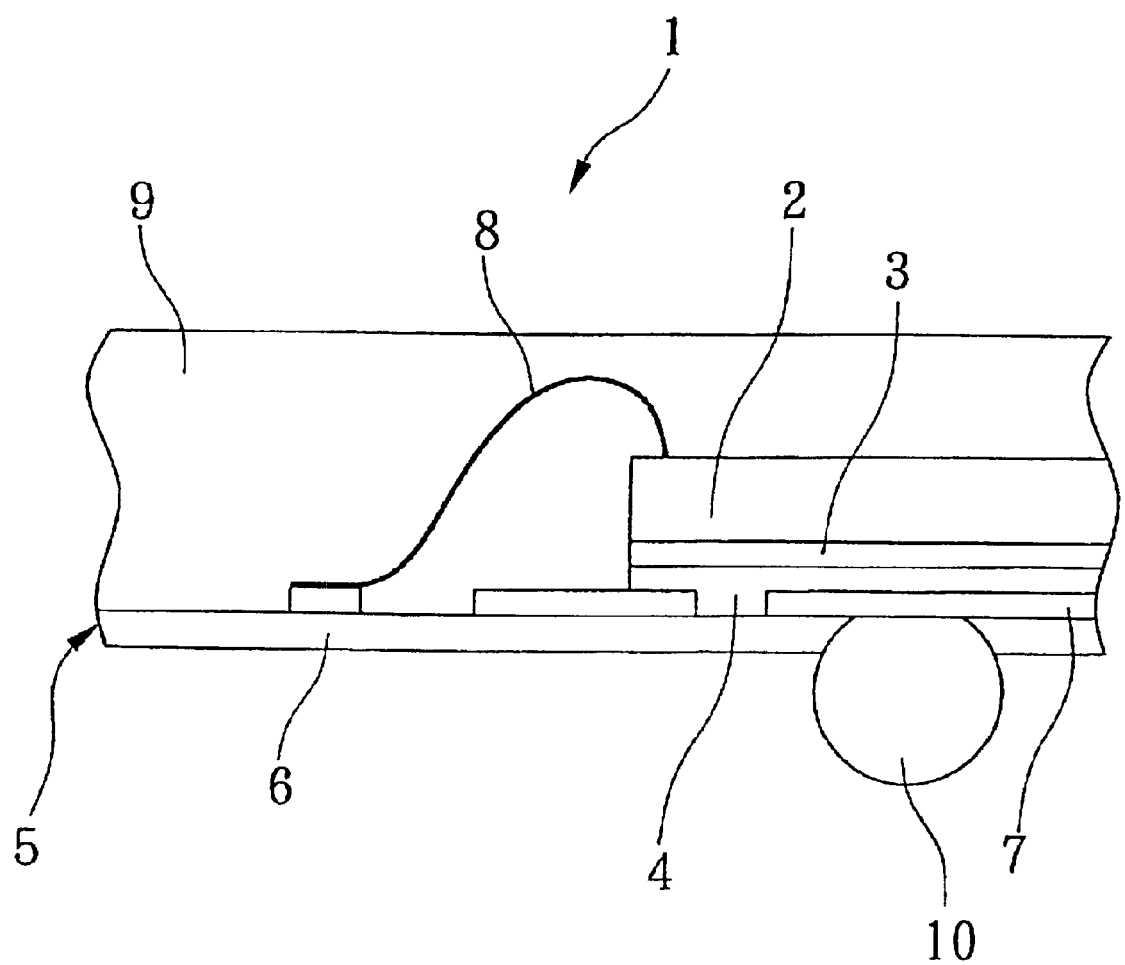
FIG. 4 is a fragmentary cross-sectional view of an internal structure of the semiconductor device according to the embodiment shown in FIGS. 3A through 3C.

A semiconductor device according to an embodiment of the present invention and a method of manufacturing the semiconductor device will be described below with reference to FIGS. 3A through 3C, 4, 5A through 5D, and 6A through 6E.

For the sake of brevity, some parts that are not essential to the present invention may be shown simplified and differ from figure to figure. For example, the number of solder balls, etc. differ from figure to figure.

The semiconductor device, generally denoted at 1, comprises a package board 5 having surface interconnections 7 thereon, a semiconductor chip 2 mounted on the surface interconnections 7, and an insulating layer 3 comprising a film by which the surface interconnections 7 and the semiconductor chip 2 are insulated from each other.

The semiconductor device 1 will first be described with reference to FIGS. 3A through 3C and 4. The semiconductor chip 2 which has a number of various circuit components and terminals (chip terminals) thereof on its surface is mounted on the package board 5 by the insulating layer 3, an adhesive layer 4, and wires 8. Specifically, the semiconductor chip 2 and the package board 5 are insulated from each other and mechanically joined to each other by the insulating layer 3 and the adhesive layer 4 that are interposed therebetween. The terminals of the semiconductor chip 2 are electrically connected to the surface interconnections 7 by the wires B. The semiconductor chip 2 and the wires 8 are encased by a sealing resin 9 for protection against damage.

Characteristics features of the semiconductor device 1, i.e., the insulation and mechanical joint between the semiconductor chip 2 and the package board 5, or more specifically the relationship between the semiconductor chip 2, the insulating layer 3, the adhesive layer 4, and the package board 5, will be described below.

As described above, the semiconductor chip 2 has a number of various circuit components and terminals (chip terminals) thereof on its surface, and the semiconductor chip 2 and the package board 5 are insulated from each other and mechanically joined to each other by the insulating layer 3 and the adhesive layer 4.

The package board 5 serves to support the semiconductor chip 2 thereon, and the surface interconnections 7 used for connection to the semiconductor chip 2 are disposed on the reverse side (upper surface in FIG. 4) of the package board 5. Therefore, the reverse side of the package board 5 has surface irregularities having a depth (height) corresponding to the thickness of the surface interconnections 7. The surface interconnections 7 have a three-layer structure which comprises a Cu layer having a thickness of 18 $\mu$m, an Ni layer having a thickness of 2 $\mu$m, and an Au layer having a thickness of 0.7 $\mu$m. The surface interconnections 7 are also disposed in a region where the semiconductor chip 1 is mounted. Solder balls 10 functioning as outer bumps for connection to other circuit devices are mounted on the face side (lower surface in FIG. 4) of the package board 5. Each of the surface interconnections 7 is connected to either one of the solder balls 10.

The insulating layer 3 serves to provide electric insulation between the semiconductor chip 2 and the surface interconnections 7, and is mounted on the reverse side (lower surface in FIG. 4) of the semiconductor chip 2. In the present embodiment, the insulating layer 3 comprises an insulating film. The semiconductor chip 2 and the insulating layer 3 are joined to each other due to the stickiness or adhesion of the insulating layer 3. The insulating layer 3 and the package board 5 are joined to each other by the adhesive layer 4. The film that can be used as the insulating layer 3 will be described in detail below with respect to a method of manufacturing the semiconductor device 1.

The adhesive layer 4 serves to join the semiconductor chip 2 (strictly, the insulating layer 3) to the package board 5 and secure the semiconductor chip 2 in place to the package board 5. Adhesive layer 4 is formed so that the irregularities on the surface of the package board 5 were filled up and covered. Since the adhesive layer 4 is required to insulate the surface interconnections 7 from each other, the adhesive layer 4 is electrically insulative. The adhesive layer 4 is not limited to any particular thickness because the electric insulation between the semiconductor chip 2 and the surface interconnections 7 is provided by the insulating layer 3, as described above.

A method of manufacturing the semiconductor device 1 will be described below with reference to FIGS. 5A through 5D and FIGS. 6A through 6E.

The method of manufacturing the semiconductor device 1 is generally divided into (1) a process of forming the semiconductor chip 2 on the insulating layer 3, and (2) a process of mounting the semiconductor chip 2 on the package board 5. Each of these processes will be described in detail below.

(1) The Process of Forming the Semiconductor Chip 2 on the Insulating Layer 3 (FIGS. 5A Through 5D)

The insulating layer 3 is made of a laminated film 20 having a double-layer structure which comprises a base film 22 and an insulating film 21.

The insulating film 21 will finally serve as the insulating layer 3. The insulating film 21 is a film which is sticky at normal temperature and becomes softened to provide higher stickiness (adhesion) by the application of heat. The insulating film 21 may comprise a film of any of various thermoplastic resins, e.g., a polyimide-based film (a film of polyimide with a desired additive mixed therein), or a polyolefin-based film such as a polyethylene film. Alternatively, the insulating film 21 may comprise a film of thermosetting resin, e.g., an epoxy-based film, or may comprise a film made of a mixture of thermoplastic resin and thermosetting resin.

The base film 22 serves to support semiconductor chips that are diced from a semiconductor wafer, to guard against falling and scattering. Therefore, the base film 22 has a certain thickness so that it will not be cut away when the semiconductor chips are diced from the semiconductor wafer. However, the thickness of the base film 21 may be determined depending on the accuracy of the dicing device. The base film 22 has a sufficient mechanical strength against rupture under various external forces that are applied when the semiconductor chips are diced from the semiconductor wafer. In this embodiment, it is necessary to peel the base film 22 off the insulating film 21 while the laminated film 20 (the insulating film 22) is being attached to the semiconductor chip 2, as described later on. Therefore, the materials, surface conditions, and joined states of the insulating film 21 and the base film 22 are selected so that the bonding strength (stickiness or adhesion) between the insulating film 21 and the semiconductor chip 2 is stronger than the bonding strength between the insulating film 21 and the base film 22. In the present embodiment, the laminated film 20 is made of LE-5000 (tradename) manufactured by Lintec inc.

Specific steps of the process of forming the semiconductor chip 2 on the insulating layer 3 will be described below with reference to FIGS. 5A through 5D.

Figure 5A:
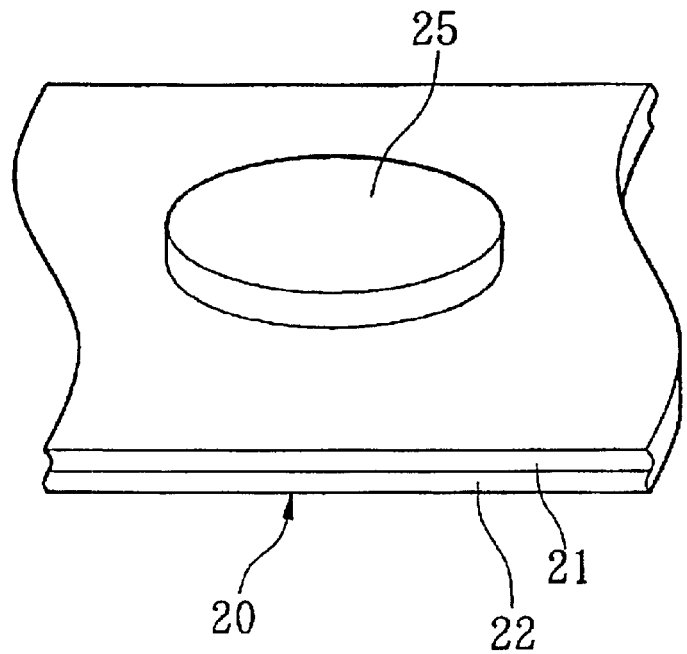
FIGS. 5A through 5D are perspective views illustrative of a method of manufacturing the semiconductor device according to the embodiment shown in FIGS. 3A through 3C.
Figure 5B:
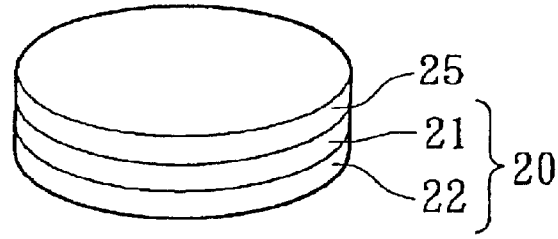

A semiconductor wafer 25 is placed on the insulating film 21 of the laminated film 20 as shown in FIG. 5A. Specifically, the semiconductor wafer 25 is placed on the insulating film 21 such that the reverse side of the semiconductor wafer 25, i.e., the surface where no circuit components are positioned, i.e., the lower surface in FIGS. 5A through 5D, is in contact with the insulating film 21, and no air will remain trapped between the semiconductor wafer 25 and the insulating film 21. Since the insulating film 21 has stickiness or adhesion at normal temperature, the semiconductor wafer 25 remains attached to the insulating film 21. If the semiconductor wafer 25 is placed on the insulating film 21 while the laminated film 20 is being heated, the since the insulating film 21 has greater stickiness or adhesion, the semiconductor wafer 25 is more reliably attached to the insulating film 21. Thereafter, the laminated film 20 is cut into a shape matching the shape of the semiconductor wafer 25, as shown in FIG. 5B.

Then, the assembly of the semiconductor wafer 25 and the laminated film 20 is diced into individual semiconductor chips 2, as shown in FIG. 5, by a dicing saw that is applied to the semiconductor wafer 25 (upper surface in FIGS. 5A through 5D). At this time, only the semiconductor wafer 25 and the insulating film 21 are diced, but not the base film 22. Therefore, when the assembly is diced, the diced semiconductor chips 2 are prevented from falling and scattering for protection against damage to the circuit components of the semiconductor chips 2. The semiconductor wafer 25 needs to be handled with utmost case because it has been ground to an extremely thin shape on its reverse side after the circuit components were fabricated. For example, the semiconductor wafer 25 in this embodiment is thinned down from an initial thickness of 600 μm to a final thickness of 200 μm after the circuit components were fabricated. According to the present embodiment, however, the semiconductor wafer 25 has an overall rigidity increased and hence can be handled with relative ease because the laminated film 20 has been applied to the reverse side of the semiconductor wafer 25.

Figure 5C:
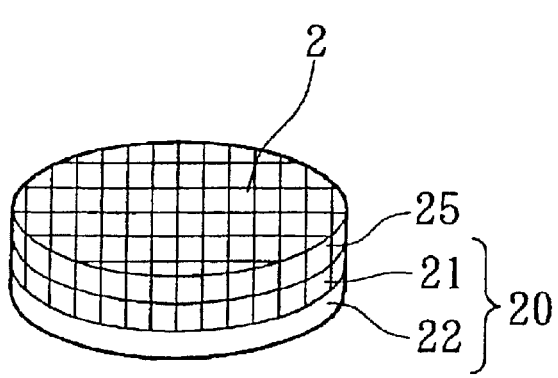
Figure 5D:
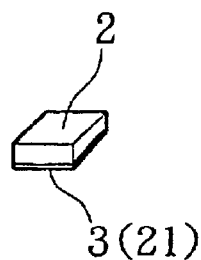

Subsequently, each of the semiconductor chips 2 is peeled off the laminated film 20. Since the bonding strength between the insulating film 21 and the semiconductor chip 2 is stronger than the bonding strength between the insulating film 21 and the base film 22, the insulating film 21 remains attached to the reverse side of the semiconductor chip 2, and is peeled off the base film 22, as shown in FIG. 5D. The insulating film 21 that remains attached to the reverse side of the semiconductor chip 2 serves as the insulating layer 3.

In the manner described above, the insulating film 21, i.e., the insulating layer 3, is attached to the reverse side of the semiconductor chip 2. The insulating layer 3 thus formed has a uniform thickness. Inasmuch as the insulating layer 3 that comprises the above insulating film 21 is harder than adhesives that have not been set, the thickness of the insulating layer 3 will not be greatly changed when pressed in the subsequent process of mounting the semiconductor chip 2 on the package board 5.

(2) The Process of Mounting the Semiconductor Chip 2 on the Package Board 5 (FIGS. 6A Through 6E)

It is assumed that the package board 5 with the surface interconnections 7 formed on the upper surface of an insulating base 6 has been prepared in advance. The surface interconnections 7 are not insulated, e.g., not coated with a solder resist, but remain exposed. The insulating base 6 is not limited to any insulating material.

Figure 6A:
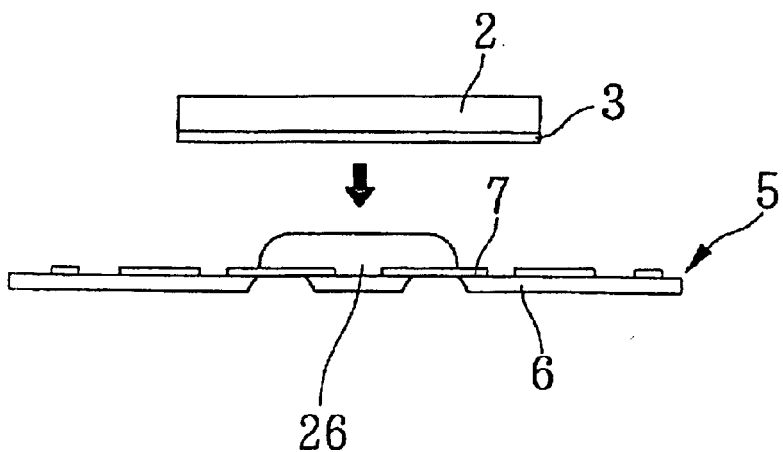
FIGS. 6A through 6E are cross-sectional views illustrative of the method of manufacturing the semiconductor device according to the embodiment shown in FIGS. 3A through 3C.
Figure 6B:
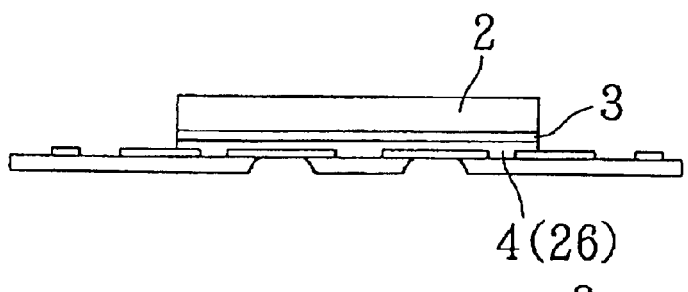

First, an insulating adhesive 26 which will serve as the adhesive layer 4 is dropped in a suitable quantity onto a region of the package board 5 where the semiconductor chip 2 will be mounted, as shown in FIG. 6A. Then, the semiconductor chip 2 with the insulating layer 3 on its reverse side is placed on the insulating adhesive 26, and pressed thereagainst under a predetermined pressure. The semiconductor chip 2 is now joined to the package board 5 with the insulating layer 3 and the insulating adhesive 26 (the adhesive layer 4) interposed therebetween, as shown in FIG. 6B. The surface of the package board 5 has surface irregularities due to the surface interconnections 7, and those surface irregularities are filled up with and covered by the insulating adhesive 26. The insulating adhesive 26 may comprise an epoxy-based resin, a polyimide-based resin, an acrylic resin, or a mixture thereof.

Since the electric insulation between the semiconductor chip 2 and the surface interconnections 7 is provided by the insulating layer 3, the insulating adhesive 26 (the adhesive layer 4) is only required to bond the semiconductor chip 2 mechanically to the package board 5. Therefore, it is not necessary to control strictly the dropping quantity of the insulating adhesive 26 and the pressure applied to join the semiconductor chip 2 to the package board 5. However, if the pressure applied to join the semiconductor chip 2 to the package board 5 is relatively high, the semiconductor chip 2 can be joined reliably to the package board 5. Because the insulating layer 3 is sufficiently harder than adhesives that have not been set, the increased pressure applied to the semiconductor chip 2 does not break the insulating layer 3 or deform the insulating layer 3 to a thin configuration. Stated otherwise, the thickness of the insulating layer 3 is prevented from being excessively reduce to impair the electric insulation between the semiconductor chip 2 and the surface interconnections 7. Furthermore, since the insulating adhesive 26 does not serve to insulate the semiconductor chip 2 and the surface interconnections 7 from each other, the dropped quantity of the insulating adhesive 26 may be held to a minimum required to join the semiconductor chip 2 mechanically to the package board 5. Consequently, when the semiconductor chip 2 is pressed, the insulating adhesive 26 is not forced outside of the semiconductor chip 2.

Figure 6C:
Figure 6D:
Figure 6E:
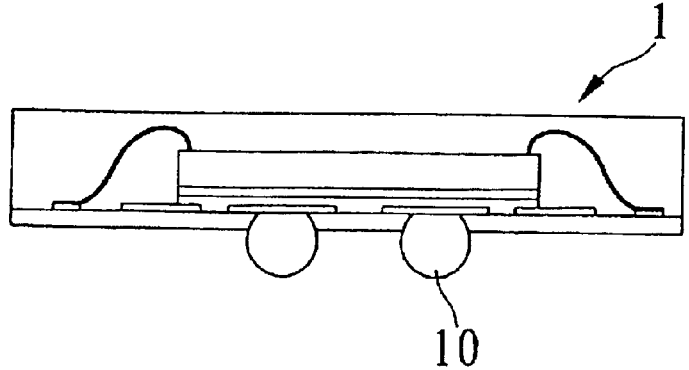

Thereafter, the surface interconnections 7 are connected to the terminals of the semiconductor chip 2 by the wires 8, as shown in FIG. 6C. The semiconductor chip 2 and the wires 8 are then encased by the sealing resin 9, as shown in FIG. 6D. Finally, the solder balls 10 are applied to the package board 5, thus completing the semiconductor device 1.

The semiconductor device 1 according to the above embodiment is highly reliable because the semiconductor chip 2 and the surface interconnections 7 on the package board 5 are reliably insulated from each other. The semiconductor wafer 25 can be handled with ease during the fabrication of the semiconductor device 1.

A semiconductor device according to another embodiment of the present invention and a method of manufacturing the semiconductor device according to the other embodiment will be described below with reference to FIGS. 7A through 7D and 8.

Those parts shown in FIGS. 7A through 7D and 8 which are identical to those shown in FIGS. 3A through 3C, 4, 5A through 5D, and 6A through 6E are denoted by identical reference characters, and will not be described in detail below.

In the previous embodiment, the laminated film 20 is used to provide the insulating layer 3 on the reverse side of the semiconductor chip 2. However, the laminated film 20 may be dispensed with. FIGS. 7A through 7D show a method of manufacturing a semiconductor device, by which the insulating layer 3 is provided without the use of the laminated film 20.

Figure 7A:
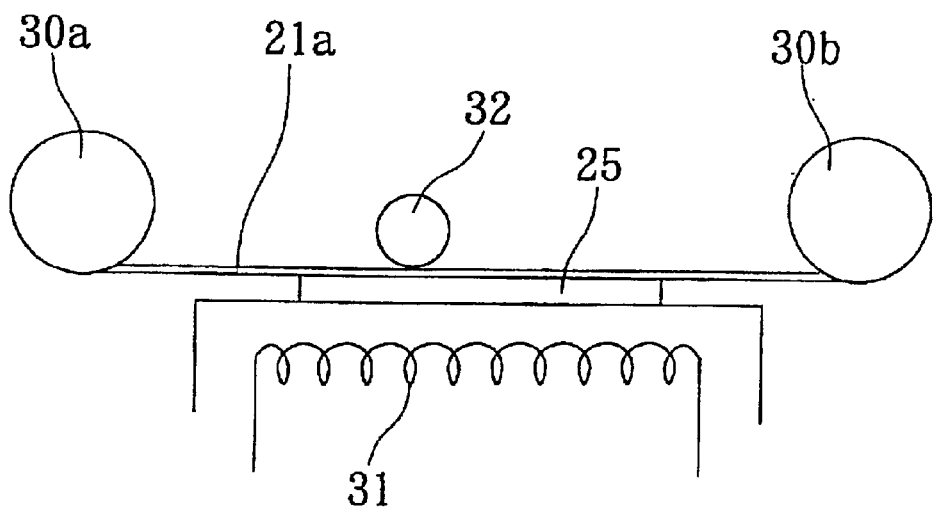
FIGS. 7A through 7D are cross-sectional views illustrative of an method of manufacturing a semiconductor device according to another embodiment of the present invention.
Figure 7B:
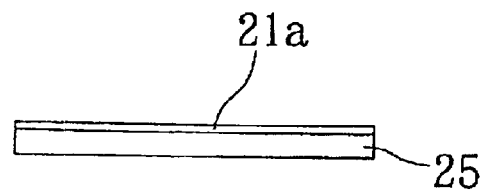
Figure 7C:
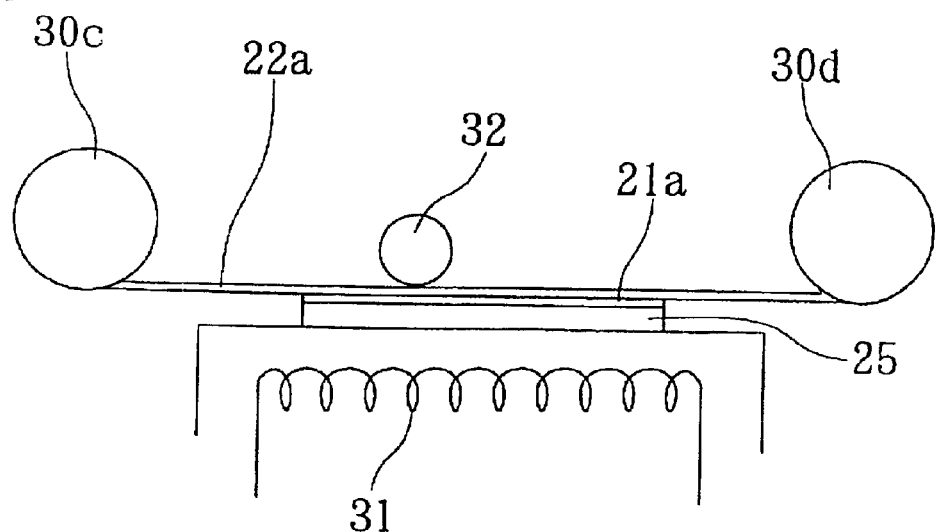
Figure 7D:
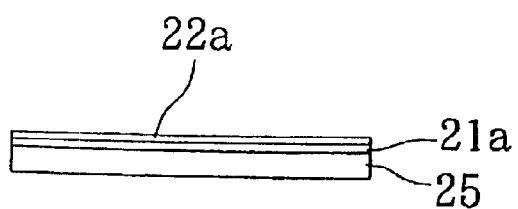

The method shown in FIGS. 7A through 7D employs an insulating film 21a and a base film 22a which are separate from each other. First, the insulating film 21a supplied from a supply reel 30 is applied to the reverse side of the semiconductor wafer 25, as shown in FIG. 7A. The insulating film 21a may be applied to the reverse side of the semiconductor wafer 25 by a roller 32 to prevent air from remaining trapped between the insulating film 21a and the semiconductor wafer 25. Then, the insulating film 21a is cut into a shape matching the shape of the semiconductor wafer 25, as shown in FIG. 7B. The base film 22a is applied to the insulating film 21a, as shown in FIG. 7C. Thereafter, the base film 22a is cut into a shape matching the shape of the semiconductor wafer 25, as shown in FIG. 7D. Subsequently, the assembly is diced in the same manner as shown in FIGS. 5C and 5D, thus producing the semiconductor chip 2 with the insulating layer 3 disposed on the reverse side thereof. Generally, a resin film becomes more sticky or adhesive when heated. Therefore, the insulating film 21a and the base film 22a can be applied more reliably to the semiconductor wafer 25 while the semiconductor wafer 25 is being heated. A film whose stickiness or adhesion is small at normal temperature may be used as the insulating film 21a and the base film 22a.

Alternatively, the insulating layer 3 may be formed on the reverse side of the semiconductor chip 2 by a spin coating process. In the spin coating process, the semiconductor chip 2 is rotated at a high speed with its reverse side facing upwardly, and an insulating liquid resin (e.g., polyimide) which will finally form the insulating layer 3 is dropped onto the central area of the reverse side of the rotating semiconductor chip 2. The dropped resin spreads into a layer of uniform thickness on the reverse side of the rotating semiconductor chip 2 under centrifugal forces. The resin layer is then set into the insulating layer 3. Thereafter, a liquid resin which exhibits the same properties as the base film 22 when set may also be dropped to form a layer which will form the base film 22. The above process of mounting the semiconductor chip 2 on the package board 5 needs to be carried out after the resin layer, i.e., the insulating layer 3, has sufficiently been set.

In the first embodiment, the laminated film 20 including the base film 22 is used to support semiconductor chips 2 that are diced from the semiconductor wafer 25, to guard against falling and scattering. However, the base film 22 or a layer which will form the base film 22 is not dispensable. For example, if the diced semiconductor chips 2 may fall and scatter or a dicing device for preventing the diced semiconductor chips 2 from falling and scattering is used, then only the insulating film 21 or the insulating layer 3 may be disposed on the reverse side of the semiconductor wafer 25 or the semiconductor chip 2. In this case, the laminated film 20 is composed of the insulating film 21 only.

In the first embodiment, the laminated film 20 is applied to the semiconductor wafer 25 which has not yet been diced into individual semiconductor chips 2, and then the assembly is diced into individual semiconductor chips 2. However, it is also possible to dice the semiconductor wafer 25 into individual semiconductor chips 2, and then form the insulating layer 3 on the reverse side of each of the semiconductor chips 2 using the laminated film 20. This alternative process suffers lower productivity than the above process in which the laminated film 20 is applied to the semiconductor wafer 25 which has not yet been diced into individual semiconductor chips 2.

In the above embodiments, the insulating film 21, i.e., the insulating layer 3, is applied to the semiconductor chip 2 due to the stickiness or adhesion of the insulating film 21 itself. However, the insulating film 21 may be applied to the reverse side of the semiconductor chip 2 by an adhesive. For ease of operation and reliability, however, it is preferable to use the stickiness of the insulating film 21 itself to apply the insulating film 21 to the semiconductor chip 2.

Figure 8:
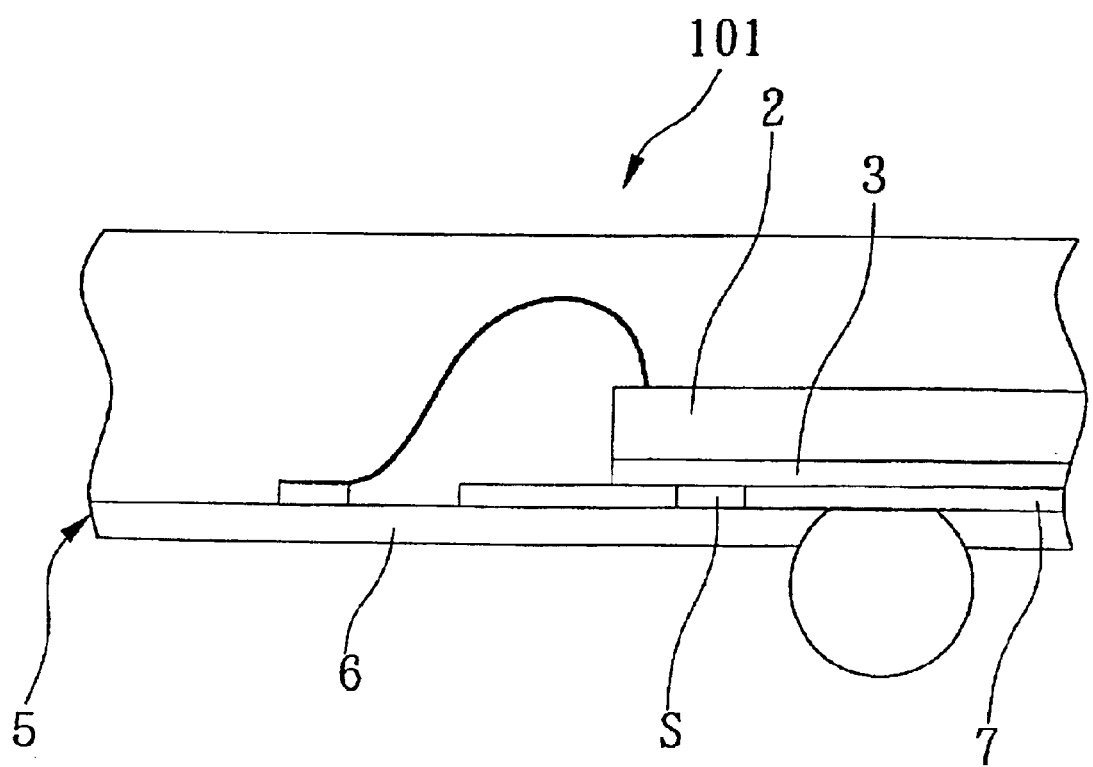
FIG. 8 is a fragmentary cross-sectional view of an internal structure of the semiconductor device according to the embodiment in FIGS. 7A through 7D.

In the above embodiments, both the insulating layer 3 and the adhesive layer 4 are used together. However, the adhesive layer 4 may be dispensed with. The semiconductor chip 2 and the package board 5 can be joined to each other by only the insulating layer 3 based on the stickiness or adhesion of the insulating layer 3 itself. Such an arrangement makes it possible to reduce the cost of the semiconductor device 1. However, the omission of the adhesive layer 4 may possibly leaves gaps S between the surface interconnections 7, i.e., recesses therebetween, as shown in FIG. 8. As a result, the above alternative arrangement is preferable only in those applications which do not require the semiconductor device 1 to be highly reliable.

While the package board 5 comprises a single layer in the illustrated embodiments, the package board 5 may comprise a multilayer board with interconnections disposed therein. The insulating base 6 of the package board 5 is not limited to any particular insulating material.

The term "film" used herein signifies a thin member having a predetermined thickness, and refers to a concept including "sheet", "tape", "thin plate", etc.

With the structure according to the present invention, the semiconductor device is highly reliable in that the semiconductor chip and the interconnections on the package board are reliably insulated from each other.

It is to be understood, however, that although the characteristics and advantages of the present invention have been set forth in the foregoing description, the disclosure is illustrative only, and changes made be made in the arrangement of the parts within the scope of the appended claims.

What is claimed is:

1. A semiconductor device comprising:
   a board with interconnections disposed on at least a face side thereof;
   a semiconductor chip with circuit components disposed on a face side thereof;
   where in an insulating film is disposed on a reverse side of said semiconductor chip;
   an adhesive layer is disposed on said insulating film on said semiconductor chip between said insulating film and a face side of said board and said interconnections, and joins said insulating film to said face side of said board, said adhesive layer having a varying thickness and filling gaps between said interconnection that are disposed between said insulating film and said board; and
   said insulating film and said adhesive layer are made of at least one material selected from the group consisting of an epoxy resin, a polyimide resin, and an acrylic resin.

2. A semiconductor device comprising:
   a board with interconnections disposed on at least a face side thereof; and
   a semiconductor chip with circuit components disposed on at least a face side thereof, said semiconductor chip being arranged to have a reverse side thereof facing said board over a region of said board where said interconnections are disposed;
   wherein an insulating adhesive film is disposed on said reverse side of said semiconductor chip, between said semiconductor chip and said face side of said board, and joins said semiconductor chip to said face side of said board;
   wherein said insulating adhesive film is made of at least one material selected from the group consisting of an epoxy resin, a polyolefin resin, and a polyimide resin; and
   wherein said insulating adhesive film comprises:
   an insulating layer; and
   an adhesive layer having a varying thickness, said adhesive layer covering said interconnections which are disposed between said insulating layer and said board and filling gaps between said interconnections.

3. A method of manufacturing a semiconductor device, comprising the steps of:
   forming an insulating film on a reverse side of a semiconductor chip; and
   forming an adhesive film on said insulating film of said semiconductor chip; and
   bonding said semiconductor chip to a board with said adhesive film, said adhesive film filling surface irregularities between said insulating film and said board having a varying thickness;
   wherein said insulating film and said adhesive film are made of at least one material selected from the group consisting of an epoxy resin, a polyimide resin, and an acrylic resin.

4. A method according to claim 3, wherein said step of forming an insulating film comprises the steps of:
   forming the insulating film on a reverse side of a semiconductor wafer which has circuit elements making up a plurality of semiconductor chips on a face side thereof; and
   thereafter, dicing said semiconductor wafer and said insulating film into individual semiconductor chips.

5. A method according to claim 4, wherein said step of forming the insulating film comprises the step of forming the insulating film according to a spin coating process.

6. A method according to claim 4, further comprising the step of:
   forming a support layer for supporting the individual semiconductor chips on said insulating film, after said insulating film is formed and before said semiconductor wafer and said insulating film are diced.

7. A method according to claim 3, wherein said step of forming an insulating film comprises the steps of:
   applying a film of a laminated structure including an insulating layer which serves as said insulating film and a base layer, to a reverse side of a semiconductor wafer with said insulating layer facing the reverse side of the semiconductor wafer;
   then dicing said semiconductor wafer and said insulating layer into individual semiconductor chips; and
   thereafter, peeling said base layer of said insulating layer which is joined to a reverse side of each of said semiconductor chips.

8. A method of manufacturing a semiconductor device, comprising the steps of:
   applying an adhesive insulating film to a reverse side of a semiconductor chip; and
   joining said semiconductor chip to a board with adhesive film, said board having surface interconnections disposed thereon;
   wherein said semiconductor chip is arranged to have a reverse side thereof facing said board over a region of said board where said interconnections are disposed;
   wherein said adhesive insulating film is made of at least one material selected from the group consisting of an epoxy resin, a polyimide resin, and an acrylic resin; and
   wherein said adhesive insulating film comprises:
   an insulating layer providing a predetermined electric insulation between said semiconductor chip and said surface interconnections; and
   an adhesive layer having a varying thickness, said adhesive layer covering said interconnections which are disposed between said insulating layer and said board and filling gaps between said interconnections.

9. A method according to claim 8, wherein said step of applying an adhesive insulating film comprises the steps of:
   applying a film of a laminated structure including an insulating layer which serves as said insulating film and a base layer, to a reverse side of a semiconductor wafer with said insulating layer facing the reverse side of the semiconductor wafer;
   then, dicing said semiconductor wafer and said insulating layer into individual semiconductor chips; and
   thereafter, peeling said base layer off said insulating layer which is joined to a reverse side of each of said semiconductor chips.

10. The semiconductor device according to claim 1,
    wherein a surface of said adhesive layer that faces said insulating film has a substantially planar surface; and
    wherein a surface of said adhesive layer that faces said interconnections and said board has an irregular surface that fills gaps and surface irregularities between said insulating film and said board.

11. The semiconductor device according to claim 2,
    wherein a surface of said adhesive layer that faces said insulating layer has a planar surface; and wherein a surface of said adhesive layer that faces said interconnections and said board has an irregular surface that fills gaps and surface irregularities between said insulating film and said board.

12. The semiconductor device according to claim 3, wherein said insulating film is harder than said adhesive film maintaining the thickness of the insulating film while pressing the adhesive film into gaps between said interconnections that are disposed between said insulating film and said board.

13. The semiconductor device according to claim 12, wherein said adhesive layer electrically insulates said interconnection from each other.

14. The semiconductor device according to claim 8,
wherein said semiconductor chip is joined to said board by pressing said semiconductor chip toward said board;
wherein said insulating film is harder than said adhesive insulating film; and
wherein the thickness of the insulating film is maintained while the adhesive film is pressed into gaps between said interconnections that are disposed between said insulating film and said board.

15. The semiconductor device according to claim 14, wherein said adhesive layer electrically insulates said interconnections from each other.

* * * * *